(12) United States Patent
Chakravorty et al.

(10) Patent No.: US 6,754,407 B2
(45) Date of Patent: Jun. 22, 2004

(54) FLIP-CHIP PACKAGE INTEGRATING OPTICAL AND ELECTRICAL DEVICES AND COUPLING TO A WAVEGUIDE ON A BOARD

(75) Inventors: Kishore K. Chakravorty, San Jose, CA (US); Johanna Swan, Scottsdale, AZ (US); Brandon C. Barnett, Beaverton, OR (US); Joseph F. Ahadian, Carlsbad, CA (US); Thomas P. Thomas, Beaverton, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/158,250

(22) Filed: May 30, 2002

(65) Prior Publication Data
US 2003/0002770 A1 Jan. 2, 2003

Related U.S. Application Data

(63) Continuation-in-part of application No. 09/892,921, filed on Jun. 26, 2001, now Pat. No. 6,512,861.

(51) Int. Cl.[7] .................................................. G02B 6/12
(52) U.S. Cl. ........................................ 385/14; 385/32
(58) Field of Search ............................. 385/14, 32, 33, 385/35, 36

(56) References Cited

U.S. PATENT DOCUMENTS

| | | | | |
|---|---|---|---|---|
| 5,337,397 A | * | 8/1994 | Lebby et al. | 385/93 |
| 5,394,490 A | * | 2/1995 | Kato et al. | 385/14 |
| 5,521,992 A | * | 5/1996 | Chun et al. | 385/14 |
| 5,600,741 A | * | 2/1997 | Hauer et al. | 385/35 |
| 5,625,734 A | * | 4/1997 | Thomas et al. | 385/88 |
| 5,696,862 A | * | 12/1997 | Hauer et al. | 385/88 |
| 5,761,350 A | * | 6/1998 | Koh | 385/14 |
| 5,831,699 A | * | 11/1998 | Wright et al. | 349/73 |
| 6,389,202 B1 | * | 5/2002 | Delpiano et al. | 385/49 |
| 6,450,699 B1 | * | 9/2002 | Murali et al. | 385/88 |
| 6,477,296 B1 | * | 11/2002 | Ogawa | 385/31 |
| 6,527,457 B2 | * | 3/2003 | Chan et al. | 385/89 |

* cited by examiner

Primary Examiner—Hae Moon Hyeon
(74) Attorney, Agent, or Firm—Pillsbury Winthrop LLP

(57) ABSTRACT

A package allowing both electrical and optical coupling between one or more integrated circuits and a printed circuit board (PCB) has an optical waveguide structures in addition to electrical connections. An optically active device is flip-chip bonded directly to an integrated circuit using solder bump technology. The optically active device has a lens attached to it to facilitate optical coupling to the optical waveguide. The integrated circuit is flip-chip bonded to a Ball Grid Array (BGA) package. The BGA package is bonded to the PCB using solder reflow technology.

22 Claims, 3 Drawing Sheets

FLIP-CHIP PACKAGE INTEGRATING OPTICAL AND ELECTRICAL DEVICES AND COUPLING TO A WAVEGUIDE ON A BOARD

RELATED APPLICATIONS

This application is a continuation-in-part of U.S. patent application Ser. No. 09/892,921, filed Jun., 26, 2001, titled "Packaging and Assembly Method for Optical Coupling,", now U.S. Pat. No. 6,512,861 B2.

BACKGROUND OF THE INVENTION

1. Technical Field

An embodiment of the invention generally relates to mounting optical and electrical devices to a substrate while coupling to an optical waveguide integrated on a printed circuit board. More particularly, the present invention relates to using conventional flip-chip packaging to integrate optical and electrical devices to a printed circuit board while simultaneously coupling the optical devices to an optical waveguide by utilizing an integrated microlens array.

2. Discussion of the Related Art

Electrical systems often use a number of integrated circuits that are mounted on a printed circuit board. Each integrated circuit includes a number of leads that extend from the packaging of the circuit. The leads of the various integrated circuits are interconnected to allow signals to be passed between the integrated circuits such that the system performs some function. For example, a personal computer includes a wide variety of integrated circuits, e.g., a microprocessor and memory chips, that are interconnected on one or more printed circuit boards in the computer.

Printed circuit boards are used to bring together separately fabricated integrated circuits. However, the use of printed circuit boards creates some problems that are not so easily overcome. A printed circuit board includes metal traces to transmit an electrical signal between the various integrated circuits. As the number of components on a printed circuit board increases, the number of metal traces needed to connect the components also increases. This fact decreases the spacing between the metal traces, which can lead to capacitance problems between the metal traces and space constraints due to the limited area available on the printed circuit board for metal traces. It is desirable to reduce the amount of physical space required by such printed circuit boards. Also, it is desirable to reduce the physical length of electrical interconnections between devices because of concerns with signal loss or dissipation and interference with and by other integrated circuitry devices.

As the density of electronic integrated circuits increases, the limiting factor for circuit speed increasingly becomes propagation delay due to capacitance associated with circuit interconnection. At relatively low clock speeds, the capacitive loading is not a significant factor. As newer applications push clock speeds into the one hundred megahertz range and beyond, capacitive loading becomes a limiting factor for circuit performance by limiting circuit speed and increasing circuit cross talk.

A continuing challenge in the semiconductor industry is to find new, innovative, and efficient ways of forming electrical connections with and between circuit devices that are fabricated on the same, and on different, wafers or dies. Relatedly, continuing challenges are posed to find and/or improve upon the packaging techniques utilized to package integrated circuitry devices. As device dimensions continue to shrink, these challenges become even more important.

One approach utilizes optical interconnection to transmit optical signals between components, particularly components located on remote regions of a board. The optical signals are composed of modulated light beams that carry data between components. An optical emitter, such as a laser, is mounted on one region of the board and emits the optical signal. The optical signals are diffracted by holographic elements into a optical waveguide. The optical signals then propagate from one point to another through the optical waveguide before being diffracted out of the optical waveguide by holographic elements and focused upon opto-electronic receivers on the surface of an integrated circuit.

However, the interface between the component, i.e., the emitter or detector, and the optical waveguide is difficult to fabricate. In this approach, holographic routing elements have to be precisely aligned with the opto-electronic receivers of the integrated circuits. The opto-electronic transmitters then have to be precisely aligned relative to the holographic routing elements in order for the modulated light beams emitted by the sources to be directed by the holographic routing element to the proper opto-electronic receivers. Achieving the required precision of alignment makes assembly into a package extremely challenging. The kinds of tolerances required are normally associated with semiconductor device fabrication processes rather than with package assembly.

Another limitation of the prior art is the lack of flexibility in the assembly of printed circuit boards. Because the optical emitters, holographic elements, waveguides, and optical detectors must be mounted during assembly of the printed circuit board, there is no flexibility in adding any of these elements or adjusting their position once the printed circuit board has been fabricated.

For reasons stated above, and for other reasons which will become apparent to those in the art upon reading and understanding the present specification, there is a need in the art for an improved technique for interconnecting individual integrated circuits in an electronic system.

DETAILED DESCRIPTION

An embodiment of the invention addresses the limitations of the prior art by providing a structure wherein optically active devices, i.e., opto-electronic transmitters and opto-electronic receivers, are individually manufactured, and optimized for performance and reliability. The optically active devices are then mounted on a PCB and aligned to a waveguide formed on the PCB.

Figure 1A:
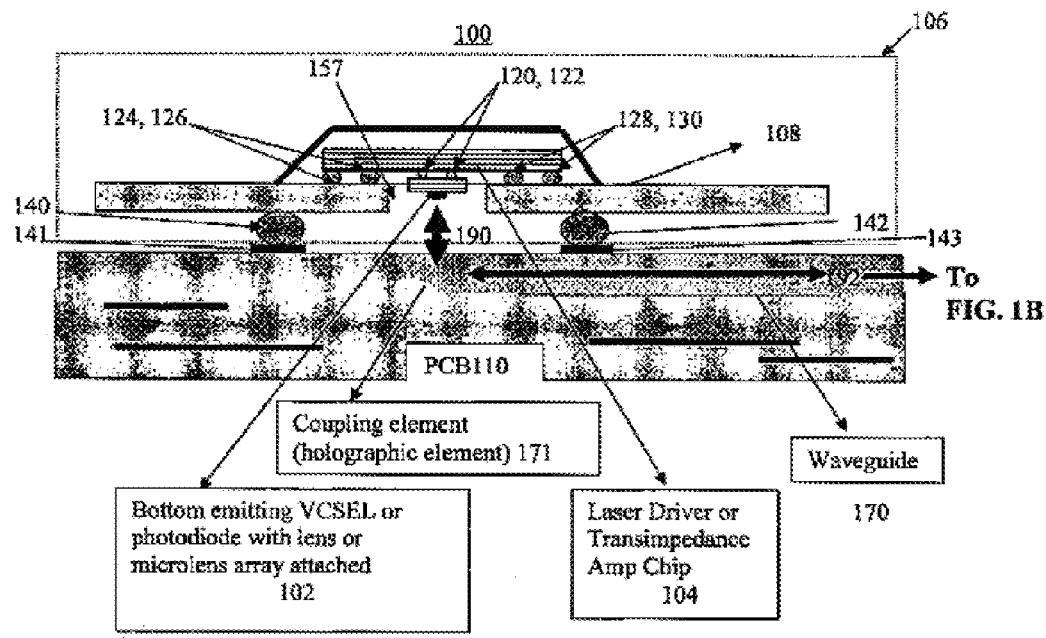
FIG. 1A and FIG. 1B illustrate a cross-sectional view of a package suitable for implementing embodiments of the present invention.

The opto-electronic transmitters and receivers 102 in FIG. 1A, for example, are first flip-chip bonded to integrated circuits 104 such as drivers, transimpedance amplifiers, microprocessors, etc. The integrated circuits 104 are then flip-chip bonded to substrates 108, which are incorporated into Ball Grid Array (BGA) 106 or Land Grid Array (LGA) packages. Flip-chip bonding, otherwise known as controlled collapsed chip connection technology or solder bump technology, involves solder bumps on the chip that are reflowed to make connection to terminal pads on the substrate.

The BGA 106 package (including the integrated circuit and the optically active device) is then bonded directly to a printed circuit board (PCB) 110 in such a way as to position the optically active devices 102 in close proximity to optical waveguides 170 deposited on the printed circuit board 110. The optically active devices 102 align with coupling elements 171 e.g. (holographic elements or 45 degree facets) incorporated into the optical waveguides 170, thus forming an optical interconnect structure.

Figure 2A:
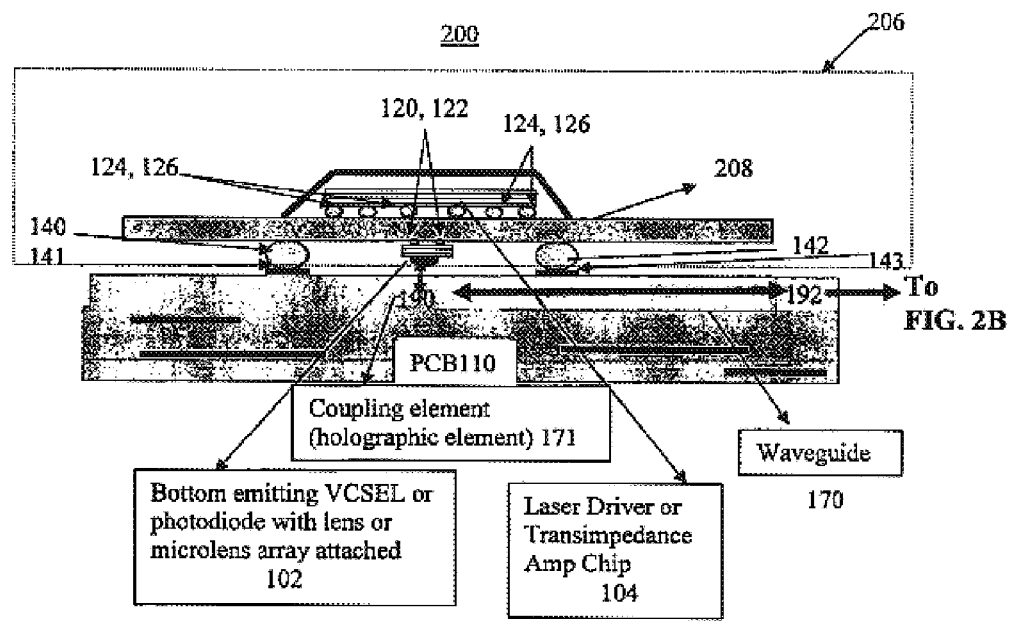
FIG. 2A and FIG. 2B illustrate is a cross-sectional view of an alternative package suitable for implementing embodiments of the present invention.

An alternative BGA package 206 suitable for implementing embodiments of the present invention is shown in FIG. 2A. A driver or transimpedance amplifier chip 104 is flip-bonded on a first surface of the BGA package substrate 208, and a bottom emitting or sensing optically active device 102 is flip-bonded on a second surface of the BGA package substrate 208, and the BGA package 206 is bonded to a printed circuit board (PCB) 110 using solder reflow technology. The example system 200 also has a waveguide 170 to direct the light from the device 102 through the PCB 110.

The present invention overcomes a significant limitation of the prior art in that precise alignment between opto-electronic devices 102 and the optical waveguide 170 is not required. In the prior art, the optical waveguides are directly deposited over the electro-optic devices using standard semiconductor fabrication techniques. To electricaly connect the various chips, the substrate has very fine feature sizes that are compatible with the input/output pitch of the various chips. The configuaration ensured an intimate contact between the opto-electronic devices and the optical waveguides and consequently good optical coupling is achieved. However, this technology can not provide a cost effective solution because it is not compatible with integrating waveguides on a conventional printed circuit board. Printed circuit boards typically have gross feature sizes (>3 mils linewidth). In addition, the prior art is not compatible with current Central Processing Unit (CPU) motherboard fabrication and assembly processes.

The present invention allows alignment requirements to be relaxed by using a lens to collimate the divergent light beam from the opto-electronic transmitter 102, or to focus a diffracted beam from the optical waveguide 170 onto a photodiode contained within the opto-electronic reciever 102. The lens is directly attached to the optically active devices 102. The lens allows the divergent light beam to be readily coupled to the optical waveguide 170 deposited in the PCB 110 without regard to the separation and original divergence of the opto-electronic transmitter 102.

In the prefered embodiment of the present invention the opto-electronic transmitter 102 is a Vertical Cavity Surface Emitting Laser (VCSEL) with an attached lens. The optical emission of the VCSEL is from the top surface of the chip. VCSEL's have a circularly semetric, nonastigmatic beam. In a custom VCSEL assembly used in a sensing application, for example, a VCSEL is mounted chip-on-board in a TO style package, with an injection-molded plastic lens aligned to the VCSEL to collimate the optical output, as well as a pair of silicon detectors and some passive elements. In an alternative embodiment of the present invention the opto-electronic transmitter 102 is an array of Vertical Cavity Surface Emitting Lasers (array of VCSEL's) with a microlens array attached.

The move to higher data rates and smaller packaging requires examination of the electrical characteristics of both the VCSEL and packaging. In a typical fiberoptic transceiver, the elements to be considered are the output impedance of the laser driver, the circuit, and traces used to carry the signal to the laser package and finally, the laser chip itself. To determine the electrical characteristics of the VCSEL, S parameter measurements may be taken with a network analyzer. Once the electrical characteristics of the VCSEL chip are known, various packaging options may be investigated, and the output stages of laser drivers and circuit board parameters may be optimized to deliver high quality electrical signals to the VCSEL.

To optimize the VCSEL performance, typical packaging rules apply: minimize both the inductance and the capacitance of the packaging by keeping the leads to the TO package as short as possible. Also minimize the distance between the laser driver and the TO package to reduce any impedance mismatched reflections, and optimize the output stage of the laser driver to drive the VCSEL TO package. For operation at data rates above a few giga-bits per second (Gb/s), the total impedance is completely dominated by the electrical parasitics of the TO package.

At higher speeds, i.e., 10 Gb/s, it may be necessary to connect the VCSEL directly to the laser driver integrated circuit 104 using a ribbon bond wire. In the prefered embodiment of the invention, the use of the bond wire is eliminated by flip-chip bonding the VCSEL chip directly to the laser driver integrated circuit 104.

The combination optically active device 102/integrated circuit 104 is tested prior to mounting to the substrate 108 of the BGA package. Any number of integrated circuits 104 may also be mounted to the substrate 108 by any suitable means; however, in a preferred embodiment, flip-chip or solder bump technology is used.

Ball Grid Array (BGA) package 106 is suitable for any integrated circuit 104 that may previously have been put in a plastic type package. The BGA package 106 is composed of three basic parts: a bare chip (shown as the driver or transimpedance amp integrated circuit 104), a BGA substrate 108, and an interconnection matrix (not shown). Depending on the package style, the bare chip may be affixed to the BGA substrate 108 either face-up or face-down. The interconnection matrix then connects the bare chip to the BGA substrate 108 using wire-bond, tape-automated-bonding (TAB), or direct attach flip-chip bonding. The BGA substrate 108, similar to a miniature multi-layer PCB with small traces and microscopic through-hole vias, conveys the signals to the underlying printed circuit board 110 through an array of solder-bump attachment pads 140, 142 on its bottom surface. A metal cover or plastic encapsulation is then used to seal the package.

BGA packages 106 are inherently low-profile. The package includes the chip, some interconnections, a thin substrate, and a plastic encapsulant. No big pins, and no lead frames are included. The low profile and small size means that the total loop area, from a signal on the chip, through the interconnection matrix onto the PCB 110, and back into the chip through the power/ground pins is very small, as little as ½ to ⅓ the size of the same loop on a typical package of equivalent pincount. This smaller loop area means less radiated noise, and less crosstalk between pins.

The BGA package 106 has relatively large, easy-to-work-with solder bumps 140, 142, much bigger than the ones used for flip-chip bonding. By way of contrast, flip-chip techniques, which use solder-balls 124, 126, 128, 130, placed directly on the face of a silicon die, require solder bumps with much smaller dimensions.

Because the BGA package 106 is an inherently thin package, it has reasonably good cooling properties. With the die mounted face-up, most of the heat flows down and out through the ball-grid array. In packages that mount the die face-down, the back side of the die is in intimate contact with the top of the package, an ideal arrangement for heatsinking.

Figure 1B:
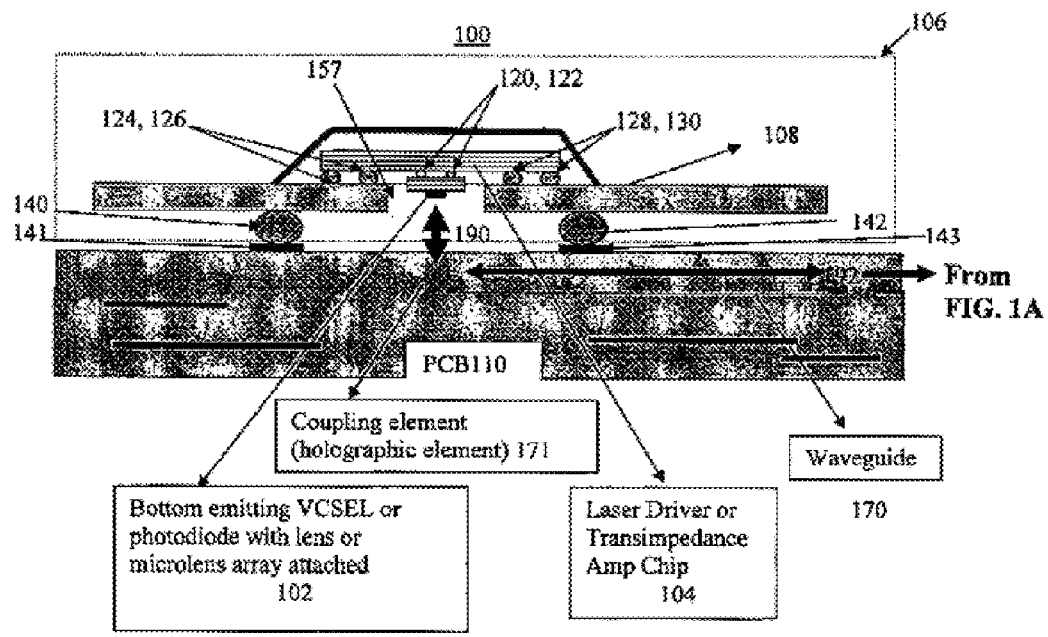

FIG. 1A and FIG. 1B illustrate a cross-sectional view of an opto-electronic system 100 suitable for implementing embodiments of the present invention. The example system 100 includes packaging that provides pitch transformation from fine pitch to coarse pitch. The system 100 includes a bottom emitting optically active device 102 (or a bottom detecting optically active device 102) that is flip-chip bonded on a driver 104 or transimpedance amplifier chip 104. The driver 104 or transimpedance amplifier chip 104 is flip-chip bonded on a ball grid array (BGA) package substrate 108, and the BGA package 106 is solder reflowed to a printed circuit board (PCB) 110 that includes a waveguide 170.

Figure 2B:
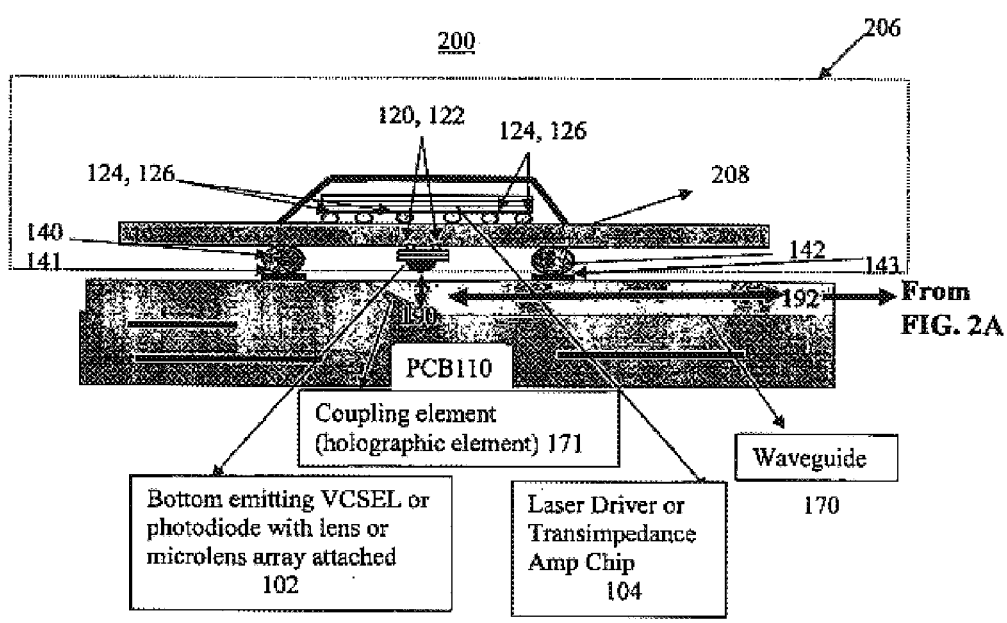

The active face (emitting or detecting surface) of optically active devices, such as the device 102, is on the side opposite of the electrical traces (the interconnect surface). Example bottom emitting or detecting optically active devices 102 are shown in 1A, FIG. 1B. FIG. 2A and FIG. 2B.

The device 102 emits (or detects) light when activated. The device 102 is surface normal and may be a Vertical Cavity Surface Emitting Lasers (VCSEL), an array of Vertical Cavity Surface Emitting Lasers, a light emitting diode (LED), a photodetector, an optical modulator, or similar optically active device 102. A lens or microlens array is attached to the device 102 to collimate the divergent optical beam.

In one embodiment, an optical via 157 is made in the BGA substrate 108 for the device 102 and the light emitted by the device 102. Light from (or to) the device 102 passes through the optical via 157. This may also be in the form of a clearance in the substrate to accomadate the VCSEL chip.

The driver or transimpedance amplifier chip 104 is any integrated circuit suitable for applying an electrical signal to the device 102 to activate the device 102. Implementation of the driver or transimpedance amplifier chip 104 is well known.

The BGA package 106 may be any known flip-chip Ball Grid Array package. The BGA substrate 108 in one embodiment is an organic laminate substrate that uses epoxy resin dielectric materials or bismaleimide triazine (BT) materials, and copper conductors or traces. In another embodiment, the BGA substrate 108 is a multi-layer ceramic substrate based on aluminum oxide ($Al_2O_3$).

The PCB 110 typically has an insulating layer made of epoxy glass. The PCB 110 also has an electric circuit with various conducting strips or traces that connect to each other based on the particular PCB application. The PCB 110 may be a multi-layer PCB with several insulating layers and conducting layers, with each conducting layer having its own traces. Printed circuit boards suitable for implementing the present invention are well known.

According to the embodiment shown in FIG. 1A the optically active device 102 is flip-chip bonded on the driver or transimpedance amplifier chip 104 using well known solder bump technology. For example, the device 102 has two solder bumps, 120 and 122, which are very tiny and spaced very close together. The device 102 may have more than two solder bumps. If the device 102 were to be mounted directly on the PCB 110, the PCB 110 would have to have very fine features to accommodate the tiny and closely spaced solder bumps 120 and 122. This requirement may cause the PCB 110 to be more complex and the manufacturing process for the PCB 110 would be costly.

The system 100 accommodates existing PCB manufacturing by mounting the device 102 to the driver or transimpedance amplifier chip 104 using the tiny solder balls 120, 122 of the device 102, and mounting the driver or transimpedance amplifier chip 104 to the BGA substrate 108. In the embodiment shown in FIG. 1, the BGA package 106 is flip-chip bonded to the PCB 110 using solder balls 140 and 142, whose pitch may be, illustratively, 1.27 millimeters, such that the pitch is compatible with conventional PCB technology and does not require high-density substrates.

The driver or transimpedance amplifier chip 104 includes bumps 124, 126, 128, and 130, which electrically connect the driver or transimpedance amplifier chip 104 to traces on the BGA substrate 108. The bumps 124, 126, 128, and 130 may be made of solder or other type of metal(s) that melt and create a bond (e.g., lead-tin compositions (PbSn), tin-silver (SnAg) compositions, nickel (Ni) compositions). In the embodiment in which the bumps 124, 126, 128, and 130 are made of solder, the solder melts during reflow and the surface tension of the molten solder centers the driver or transimpedance amplifier chip 104 correctly over the BGA substrate 108.

In some instances, it may be desirable to direct light from the device 102 on the PCB 110. In one embodiment, the PCB 110 has an optical waveguide 170 for this purpose. The waveguide 170 contains coupling elements 171 and the waveguide 170 may be laminated on the PCB 110. The coupling elements may include holographic gratings made of dichromated gelatin film, photosensitive polymer film, gratings etched photolithographically into the waveguides or waveguides faceted at 45 degrees.

For fine alignment of the BGA package 106 to the PCB 110, the solder balls 140 and 142 are subject to high temperature, which causes the solder balls 140 and 142 to melt. When the solder balls 140 and 142 melt, the surface tension pulls the BGA package 106 into alignment with the PCB 110. Surface tension is the attraction that the molecules at the surface of a drop of melted solder have for each other. The attraction the solder molecules have for each other is greater than the attraction the solder molecules have for the BGA substrate 108 so that the solder does not spread.

When the BGA package 106 is placed over the PCB 110, the solder balls 140 and 142 of the BGA package 106 rest over pad areas 141 and 143, respectively, on the PCB 110. Thus, the solder ball-to-pad contact determines the vertical separation of the BGA package 106 and the PCB 110. This feature ensures that solder balls and pad areas will remain in an intimate (i.e., high coupling efficiency) optical contact after assembly of the package 100.

The embodiment shown in FIG. 1A also provides fine alignment of the BGA package 106 with the PCB 110. The solder balls 140 and 142 rest on the pads 141 and 143, respectively, and self-align within the pads 141 and 143 during solder reflow. In this embodiment, the solder balls 140 and 142 set the height of the package 100 in the "z" dimension and have no constraints in the "x" dimension or the "y" dimension. The final tolerance may be determined by the placement accuracy of the flat pads 141 and 143.

The resulting fine alignment provided by solder reflow techniques ensures the light emitted by the device 102 is properly aligned with the coupling elements 171 of the waveguide 170 on the PCB 110. After bonding, the aligned package 100 positions the device 102 correctly over the coupling elements 171 of the waveguide 170.

The solder metallurgy for the joint(s) between the device 102 and the driver or transimpedance amplifier chip 104 has a higher melting temperature than the solder metallurgy for the joint(s) between the driver or transimpedance amplifier chip 104 and the BGA substrate 108. For example, well-known 63Pb/37Sn solder melts at 187 degrees Centigrade. This use of solder is done to ensure that joint(s) between the device 102 and the driver or transimpedance amplifier chip 104 maintains its integrity when the driver or transimpedance amplifier chip 106 is flip-chip bonded to the BGA substrate 108. In one embodiment, the solder bumps on the device 102 may be the same material as the solder bumps on the device 104 and the solder on the board has a lower melting point than the solder bumps.

The arrows 190 and 192 in FIG. 1A illustrate the direction light travels from the emitting device 102, to the waveguide structure 170, and to a receiving optically active device 102 (shown in FIG. 1B). The reverse is true for light arriving at the receiving optically active device shown in FIG. 1B. Although FIG. 1A and FIG. 1B illustrate light traveling from the emitting device 102 in FIG. 1A to the receiving optically active device 102 shown in FIG. 1B, the light may also travel in a bidirectional manner from an emitting device 102 in FIG. 1B to a receiving optically active device 102 shown in FIG. 1A.

FIG. 2A and FIG. 2B illustrate a cross-sectional view of an alternative BGA package 206 suitable for implementing embodiments of the present invention. A driver or transimpedance amplifier chip 104 is flip-bonded on a first surface of the BGA package substrate 208, and a bottom emitting or sensing optically active device 102 is flip-bonded on a second surface of the BGA package substrate 208, and the BGA package 206 is bonded to a printed circuit board (PCB) 110 using solder reflow technology. The example system 200 also has a waveguide 170 to direct the light from the device 102 through the PCB 110.

The arrows 190 and 192 illustrate the direction light travels from the emitting device 102, to the waveguide structure 170, and to a receiving optically active device 102 (shown in FIG. 2B). The reverse is true for light arriving at the receiving optically active device 102 shown in FIG. 2B. Although FIG. 2A and FIG. 2B illustrate light traveling from the emitting device 102 in FIG. 2A to the receiving optically active device 102 shown in FIG. 2B, the light may also travel in a bidirectional manner from an emitting device 102 in FIG. 2B to a receiving optically active device 102 shown in FIG. 2A.

Figure 3:
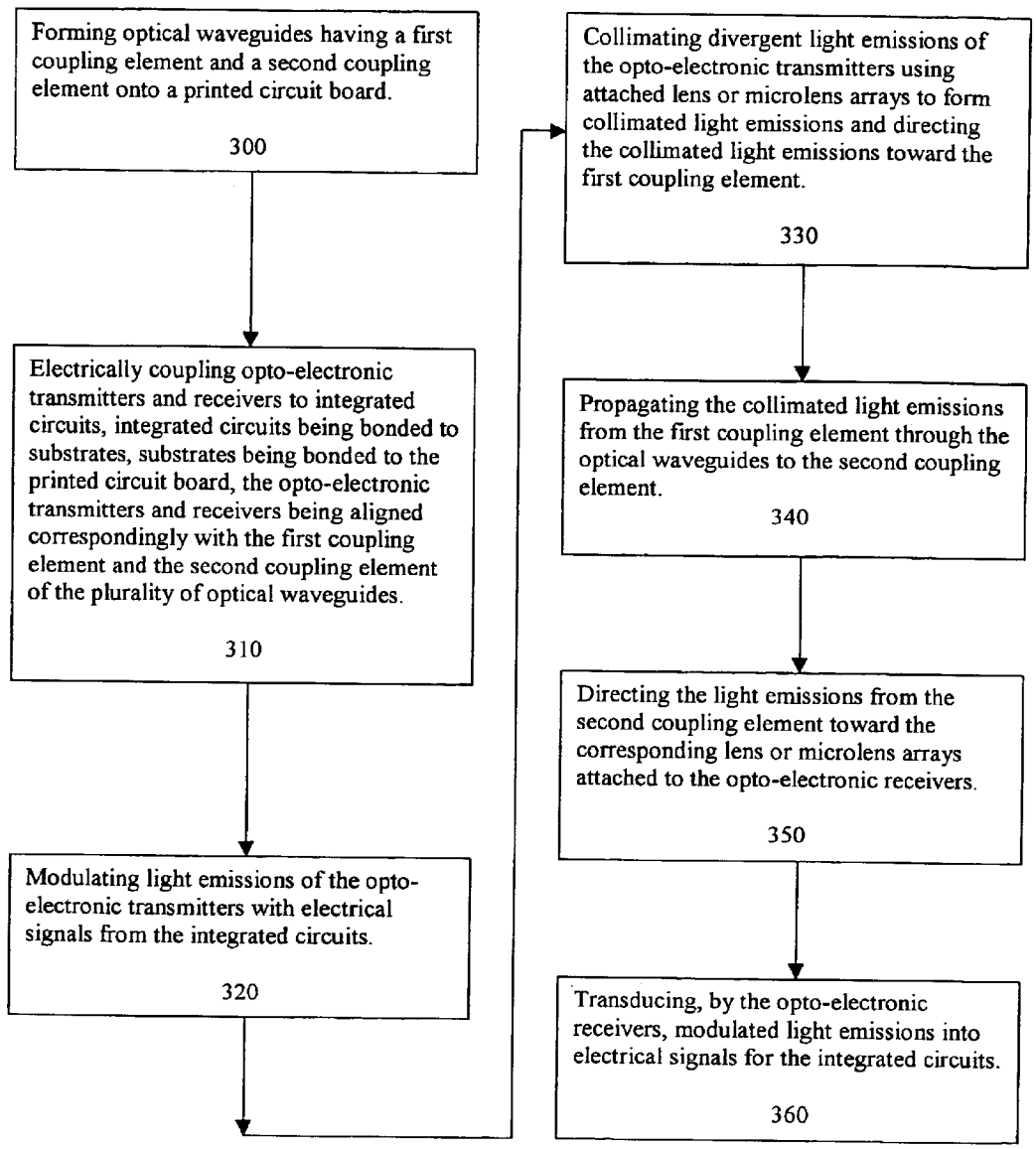
FIG. 3 illustrates a flow chart for a method of optically interconnecting integrated circuits according to an embodiment of the present invention.

FIG. 3 illustrates a flow chart for a method of optically interconnecting integrated circuits according to an embodiment of the present invention. Optical waveguides 300 are formed having a first coupling element and a second coupling element onto a printed circuit board.

Opto-electronic transmitters and receivers are electrically coupled 310 to integrated circuits, the integrated circuits being bonded to substrates, the substrates being bonded to the printed circuit board, the opto-electronic transmitters and receivers being aligned correspondingly with the first coupling element and the second coupling element of the plurality of optical waveguides.

Electrical signals from the integrated circuits modulate 320 light emissions of the opto-electronic transmitter. The microlens array attached to the opto-electronic transmitter collimates 330 divergent light emissions to form collimated light emissions and directs the collimated light emissions toward the first coupling element.

The collimated light emissions propagates 340 from the first coupling element through the optical waveguide to the second coupling element. The second coupling element directs the light emissions 350 toward the corresponding microlens array attached to the opto-electronic receiver. Finally, the opto-electronic receiver transduces 360 the modulated light emissions into electrical signals for the integrated circuit.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A method of optically interconnecting integrated circuits, comprising:

forming a plurality of optical waveguides having a first coupling element and a second coupling element onto a printed circuit board;

electrically coupling opto-electronic transmitters and receivers to integrated circuits, said integrated circuits being bonded to substrates, said substrates being bonded to the printed circuit board, the opto-electronic transmitters and receivers being aligned correspondingly with the first coupling element and the second coupling element of the plurality of optical waveguides;

modulating light emissions of the opto-electronic transmitters with electrical signals from the integrated circuits to form divergent modulated light emissions;

emitting divergent modulated light emissions;

collimating divergent modulated light emissions of the opto-electronic transmitters using attached lens to form collimated modulated light and directing the collimated modulated light toward the first coupling element;

receiving, by the first coupling element, the collimated modulated light and forming propagating modulated light;

transporting the propagating modulated light from the first coupling element through the optical waveguides to the second coupling element;

directing the propagating modulated light from the second coupling element toward the corresponding lens attached to the opto-electronic receivers to form modulated light emissions; and transducing, by the opto-electronic receivers, the modulated light emissions into electrical signals for the integrated circuits.

2. The method of claim 1, wherein electrically coupling the opto-electronic transmitters and receivers to the integrated circuits includes using flip-chip bonded solder bump connection technology.

3. An opto-electronic system to optically interconnect integrated circuits, comprising:

an opto-electronic transmitter having an emitting surface and an interconnect surface, the interconnect surface being bonded to a first integrated circuit, the opto-electronic transmitter emitting a divergent modulated light beam from the emitting surface through an attached first lens to form a collimated modulated light beam;

a first substrate including a first surface bonded to the first integrated circuit, and a second surface bonded to a printed circuit board;

an optical waveguide in close proximity to the first lens attached to the opto-electronic transmitter, wherein the optical waveguide is formed on the printed circuit board, contains a first coupling element to receive the collimated modulated light beam emitted by the opto-electronic transmitter to form propagating modulated light and to re-direct the propagating modulated light through the optical waveguide, and a second coupling element to re-direct the propagating modulated light out of the optical waveguide to a second lens attached to an opto-electronic receiver and in close proximity with the second coupling element;

a second integrated circuit bonded to the opto-electronic receiver; and a second substrate including a first surface bonded to the second integrated circuit, and a second surface bonded to the printed circuit board.

4. The opto-electronic system according to claim 3, wherein the first surface of the first substrate is bonded to a second surface of the first integrated circuit and the opto-electronic transmitter is bonded to the second surface of the first integrated circuit, and the second surface of the first substrate is bonded to the printed circuit using flip-chip bonded solder bump connection technology.

5. The opto-electronic system according to claim 3, wherein the first surface of the second substrate is bonded to a second surface of the second integrated circuit and the opto-electronic receiver is bonded to the second surface of the second integrated circuit, and the second surface of the second substrate is bonded to the printed circuit using flip-chip bonded solder bump connection technology.

6. The opto-electronic system according to claim 3, wherein the opto-electronic transmitter is a Vertical Cavity Surface Emitting Laser (VCSEL).

7. The opto-electronic system according to claim 3, wherein the opto-electronic transmitter is an array of Vertical Cavity Surface Emitting Lasers (VCSEL).

8. The opto-electronic system according to claim 3, wherein the opto-electronic receiver is a photodiode.

9. The opto-electronic system according to claim 3, wherein the first and second substrates are contained within Ball Grid Array (BGA) packages or Land Grid Array (LGA) packages.

10. The opto-electronic system according to claim 3, wherein one or more integrated circuits are bonded to the first and second substrates, and electrically coupled to the opto-electronic transmitter and opto-electronic receiver.

11. The opto-electronic system according to claim 3, wherein the first and second coupling elements include sloped facets or holographic elements formed in the optical waveguide.

12. The opto-electronic system according to claim 11, wherein the holographic elements are formed in the optical waveguide such that holographic elements diffract the modulated light into or out of the optical waveguide.

13. An opto-electronic system to optically interconnect integrated circuits, comprising:

an opto-electronic transmitter having an emitting surface and an interconnect surface, the interconnect surface being bonded to a second surface of a first substrate, the opto-electronic transmitter emitting a divergent modulated light beam from the emitting surface through an attached first lens to form a collimated modulated light beam;

the first substrate including a first surface bonded to a first integrated circuit, and the second surface bonded to a printed circuit board;

an optical waveguide in close proximity to the first lens attached to the opto-electronic transmitter, wherein the optical waveguide is formed on the printed circuit board, contains a first coupling element to receive the collimated modulated light beam emitted by the opto-electronic transmitter to form propagating modulated light and to re-direct the propagating modulated light through the optical waveguide, and a second coupling element to re-direct the propagating modulated light out of the optical waveguide to a second lens attached to an opto-electronic receiver and in close proximity with the second coupling element;

a second surface of a second substrate bonded to the opto-electronic receiver; and the second substrate including a first surface bonded to the second integrated circuit, and the second surface bonded to the printed circuit board.

14. The opto-electronic system according to claim 13, wherein the first surface of the first substrate is bonded to the first integrated circuit and the second surface of the first substrate is bonded to the opto-electronic transmitter, and the second surface of the first substrate is bonded to the printed circuit using flip-chip bonded solder bump connection technology.

15. The opto-electronic system according to claim 13, wherein the first surface of the second substrate is bonded to the second integrated circuit and the second surface of the second substrate is bonded to the opto-electronic receiver, and the second surface of the second substrate is bonded to the printed circuit board, using flip-chip bonded solder bump connection technology.

16. The opto-electronic system according to claim 13, wherein the opto-electronic transmitter is a Vertical Cavity Surface Emitting Laser (VOSEL).

17. The opto-electronic system according to claim 13, wherein the opto-electronic transmitter is an array of Vertical Cavity Surface Emitting Lasers (VCSEL).

18. The opto-electronic system according to claim 13, wherein the opto-electronic receiver is a photodiode.

19. The opto-electronic system according to claim 13, wherein the first and second substrates are contained within Ball Grid Array (BGA) packages or Land Grid Array (LGA) packages.

20. The opto-electronic system according to claim 13, wherein one or more integrated circuits are bonded to the first and second substrates, and electrically coupled to the opto-electronic transmitter and opto-electronic receiver.

21. The opto-electronic system according to claim 13, wherein the first and second coupling elements include sloped facets or holographic elements formed in the optical waveguide.

22. The opto-electronic system according to claim 21, wherein the holographic elements are formed in the optical waveguide such that holographic elements diffract the modulated light into or out of the optical waveguide.

* * * * *